(12) United States Patent
Park et al.

(10) Patent No.: US 8,536,026 B2
(45) Date of Patent: Sep. 17, 2013

(54) SELECTIVE GROWTH METHOD, NITRIDE SEMICONDUCTOR LIGHT EMITTING DEVICE AND MANUFACTURING METHOD OF THE SAME

(75) Inventors: Hee Seok Park, Gyunggi-do (KR); Gil Han Park, Gyunggi-do (KR); Sang Duk Yoo, Gyunggi-do (KR); Young Min Park, Gyunggi-do (KR); Hak Hwan Kim, Gyunggi-do (KR); Seon Young Myoung, Gyunggi-do (KR); Sang Bum Lee, Gyunggi-do (KR); Ki Tae Park, Gyunggi-do (KR); Myoung Sik Jung, Seoul (KR); Kyeong Ik Min, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 538 days.

(21) Appl. No.: 11/822,185

(22) Filed: Jul. 3, 2007

(65) Prior Publication Data
US 2008/0035951 A1 Feb. 14, 2008

(30) Foreign Application Priority Data
Aug. 9, 2006 (KR) ........................ 10-2006-0075407

(51) Int. Cl.
*H01L 29/24* (2006.01)
*H01L 21/36* (2006.01)
*H01L 33/00* (2010.01)

(52) U.S. Cl.
USPC .................... 438/478; 257/103; 257/E21.131; 257/E21.132; 257/E33.025; 438/46

(58) Field of Classification Search
USPC ...................... 257/95, 79, 81, 94, 98, 99, 103
See application file for complete search history.

(56) References Cited

U.S. PATENT DOCUMENTS 5,418,395 A * 5/1995 Nagata et al. ................. 257/103
(Continued)

FOREIGN PATENT DOCUMENTS

| JP | 2001-284724 | 10/2001 |
| JP | 2002-100805 | 4/2002 |
| JP | 2002-261380 | 9/2002 |
| JP | 2002-313742 | 10/2002 |
| JP | 2004-288799 | 10/2004 |

OTHER PUBLICATIONS

German Office Action, w/ English translation thereof, issued in German Patent Application No. 10 2007 027 658.5-33 dated Sep. 25, 2009.

(Continued)

*Primary Examiner* — David Vu
*Assistant Examiner* — Jonathan Han
(74) *Attorney, Agent, or Firm* — McDermott Will & Emery LLP

(57) ABSTRACT

A method for selectively growing a nitride semiconductor, in which a mask is formed, with an opening formed therein, on a nitride semiconductor layer. A nitride semiconductor crystal is selectively grown on a portion of the nitride semiconductor layer exposed through the opening in the mask, the nitride semiconductor crystal shaped as a hexagonal pyramid and having crystal planes inclined with respect to a top surface of the nitride semiconductor. Here, the nitride semiconductor crystal has at least one intermediate stress-relieving area having crystal planes inclined at a greater angle than those of upper and lower areas of the nitride semiconductor crystal, the intermediate stress-relieving area relieving stress which occurs from continuity in the inclined crystal planes.

17 Claims, 5 Drawing Sheets

(56) References Cited

U.S. PATENT DOCUMENTS

| | | | |
|---|---|---|---|
| 6,320,209 B1 * | 11/2001 | Hata et al. | 257/190 |
| 6,924,500 B2 | 8/2005 | Okuyama et al. | |
| 6,927,423 B2 * | 8/2005 | Sawaki et al. | 257/95 |
| 7,067,339 B2 * | 6/2006 | Biwa et al. | 438/39 |
| 2003/0141508 A1 | 7/2003 | Okuyama et al. | |
| 2005/0179025 A1 * | 8/2005 | Okuyama et al. | 257/13 |
| 2005/0247949 A1 * | 11/2005 | Senda et al. | 257/98 |

OTHER PUBLICATIONS

Korean Office Action, w/ English translation thereof, issued in Korean Patent Application No. KR 10-2006-0075407 dated Sep. 27, 2007.

Japanese Office Action, w/ English translation thereof, issued in Japanese Patent Application No. JP 2007-157204 dated Mar. 30, 2010.

* cited by examiner (a)

(b)

SELECTIVE GROWTH METHOD, NITRIDE SEMICONDUCTOR LIGHT EMITTING DEVICE AND MANUFACTURING METHOD OF THE SAME

CLAIM OF PRIORITY

This application claims the benefit of Korean Patent Application No. 2006-75407 filed on Aug. 9, 2006 in the Korean Intellectual Property Office, the disclosure of which is incorporated herein by reference.

BACKGROUND OF THE INVENTION

1. Field of the Invention

The present invention relates to a method for growing a nitride semiconductor, and more particularly, to a method for selectively growing a nitride semiconductor of a hexagonal pyramid, a nitride light emitting device manufactured using the same method and a manufacturing method of the same device.

2. Description of the Related Art

Recently, a semiconductor light emitting device has been vigorously studied as a new light source to replace a filament-based bulb and a fluorescent lamp. Especially, attention has been drawn on a study on a light emitting diode (LED) using a nitride compound semiconductor such as GaN. A nitride crystal is accompanied by many crystal defects due to absence of an adequate substrate for growth thereof.

In an effort to overcome this problem, a light emitting structure of a hexagonal pyramid is selectively grown to produce a high-quality nitride light emitting device.

FIG. 1 is a cross-sectional view illustrating an example of a light emitting device of a hexagonal pyramid.

As shown in FIG. 1, a low-temperature buffer layer 12 is formed on a sapphire substrate 11. A base layer 13 made of a first conductive nitride is formed on the substrate 11. A dielectric layer M, with a window W formed therein, is formed on the base layer 13 of the first conductive nitride. A first conductive nitride crystal 14 of a hexagonal pyramid is formed on the window 1 to have crystal planes inclined with respect to a top surface of the base layer. Then, an active layer 15 and a second conductive nitride layer 16 are sequentially grown to produce a light emitting structure of a hexagonal pyramid.

At least one of a transparent conductive film 17 and an electrode 19 is formed on the second conductive nitride layer 16 of the hexagonal pyramid. The dielectric layer is partially etched to expose the first conductive nitride base layer 13, thereby forming another electrode of a different polarity.

While the nitride single crystal of the hexagonal pyramid grown selectively as described above is being grown laterally, many defects are removed from a lower part or altered in their direction, thereby rarely affecting the active layer. Moreover, in the nitride single crystal, inclined side surfaces substantially increase a light emitting area and a crystal growth direction alleviates a piezo-electric field effect.

However, despite the aforesaid advantages, the conventional nitride light structure of the hexagonal pyramid experiences a difference in the growth rate between the base and the apex of the pyramidal structure due to stress caused by the inclined side surfaces. This accordingly brings about difference in thickness and In content between a quantum well layer and a barrier layer. That is, as shown in FIG. 1, a portion of the active layer in the vicinity of the base of the pyramidal structure has a thickness smaller than a portion of the active layer around the apex thereof, thereby hardly obtaining light of a desired wavelength. Furthermore, the conventional nitride light structure has degraded p-doping characteristics due to stress induced by the inclined side surfaces.

SUMMARY OF THE INVENTION

The present invention has been made to solve the foregoing problems of the prior art and therefore an aspect of the present invention is to provide a novel method for selectively growing a nitride semiconductor having a nitride semiconductor crystal of a hexagonal pyramid in which an intermediate stress-relieving area is formed to relieve stress caused by inclined side surfaces.

Another aspect of the invention is to provide a nitride semiconductor light emitting device having a nitride semiconductor crystal of a hexagonal pyramid in which an intermediate stress-relieving area is formed to relieve stress caused by inclined side surfaces.

Further another aspect of the invention is to provide a method for manufacturing the nitride semiconductor device as described above.

According to an aspect of the invention, the method for selectively growing a nitride semiconductor includes:

forming a mask, with an opening formed therein, on a nitride semiconductor layer; and selectively growing a nitride semiconductor crystal on a portion of the nitride semiconductor layer exposed through the opening in the mask, the nitride semiconductor crystal shaped as a hexagonal pyramid and having crystal planes inclined with respect to a top surface of the nitride semiconductor, wherein the nitride semiconductor crystal has at least one intermediate stress-relieving area having crystal planes inclined at a greater angle than those of upper and lower areas of the nitride semiconductor crystal, the intermediate stress-relieving area relieving stress which occurs from continuity in the inclined crystal planes.

Preferably, the step of selectively growing a nitride semiconductor crystal includes:

performing a first growth procedure for growing the nitride semiconductor crystal at a first growth rate which satisfies a growth mode for the hexagonal pyramid;

performing a second growth procedure for growing the nitride semiconductor crystal at a second growth rate higher than the first growth rate, thereby forming the intermediate stress-relieving area; and performing a third growth procedure for growing the nitride semiconductor crystal at a third growth rate which satisfies a growth mode for the hexagonal pyramid, the third growth rate being lower than the second growth rate.

Here, the step of selectively growing a nitride semiconductor crystal includes repeating the second and third growth procedures at least once, thereby producing a hexagonal pyramidal nitride semiconductor having at least three tiers. Also, the first and third growth rates are identical.

Preferably, the intermediate stress-relieving area of the hexagonal pyramid according to the invention has crystal planes inclined at a sufficient angle to increase effects of relaxing stress. Preferably, the second growth rate is at least 20% higher than the first and third growth rates.

Specifically, the first and third growth rates range from 7 µm/hr to 9 µm/hr and the second growth rate is at least 10 µm/hr.

Preferably, the step of selectively growing the nitride semiconductor crystal includes controlling the growth rates by regulating a flow rate of a group III source gas. But the invention is not limited thereto, and the growth rate can be controlled by regulating pressure and/or a group V/III ratio.

Preferably, the intermediate stress-relieving area has a thickness ranging from 0.1 μm to 2 μm.

In the nitride single crystal of the Wurtzite structure, the nitride semiconductor crystal of the hexagonal pyramid excluding the intermediate stress-relieving area has S-oriented crystal planes, and the intermediate stress-relieving area has non-S crystal planes. Also, the nitride semiconductor crystal of the hexagonal pyramid excluding the intermediate stress-relieving area has crystal planes inclined at an angle of 60° to 65°, and the intermediate stress-relieving area has crystal planes inclined at 80° to 150°.

According to another aspect of the invention, the nitride semiconductor light emitting diode includes a first conductive nitride semiconductor layer having at least one hexagonal pyramidal crystal structure formed on a top surface thereof, the hexagonal pyramidal crystal structure having crystal planes inclined with respect to the top surface, and including at least one intermediate stress-relieving area having crystal planes inclined at a greater angle than those of upper and lower areas of the nitride semiconductor crystal; and an active layer and a second conductive nitride semiconductor layer sequentially formed on the crystal planes of the hexagonal pyramidal crystal structure.

Preferably, the hexagonal pyramidal structure has a plurality of intermediate stress-relieving areas spaced apart from one another, thereby forming at least three tiers of the pyramidal structure. This effectively relieves stress from the inclined side surfaces.

Preferably, the crystal planes of the upper and lower areas are identical.

Preferably, the intermediate stress-relieving area has a thickness ranging from 0.1 to 2 μm.

According to further another aspect of the invention, the method for manufacturing a nitride semiconductor light emitting diode includes:

forming a mask, with at least one opening formed therein, on a base layer made of a first conductive nitride semiconductor;

selectively growing a first conductive nitride semiconductor crystal on the base layer exposed through the opening in the mask, the first conductive nitride semiconductor crystal shaped as a hexagonal pyramid and having crystal planes inclined with respect to a top surface of the base layer; and sequentially growing an active layer and a second conductive nitride semiconductor layer on the first conductive nitride semiconductor crystal, wherein the first conductive nitride semiconductor crystal has at least one intermediate stress-relieving area having crystal planes inclined at a greater angle than those of upper and lower areas of the first conductive nitride semiconductor crystal, the intermediate stress-relieving area relieving stress which occurs from continuity in the inclined crystal planes.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
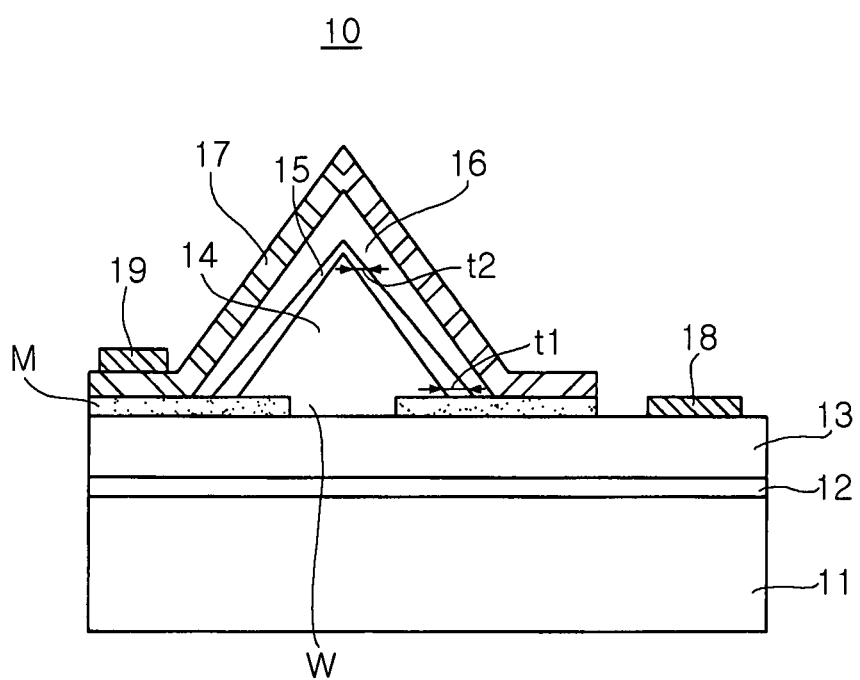
FIG. 1 is a side cross-sectional view illustrating a conventional light emitting diode of a hexagonal pyramid.
Figure 2:
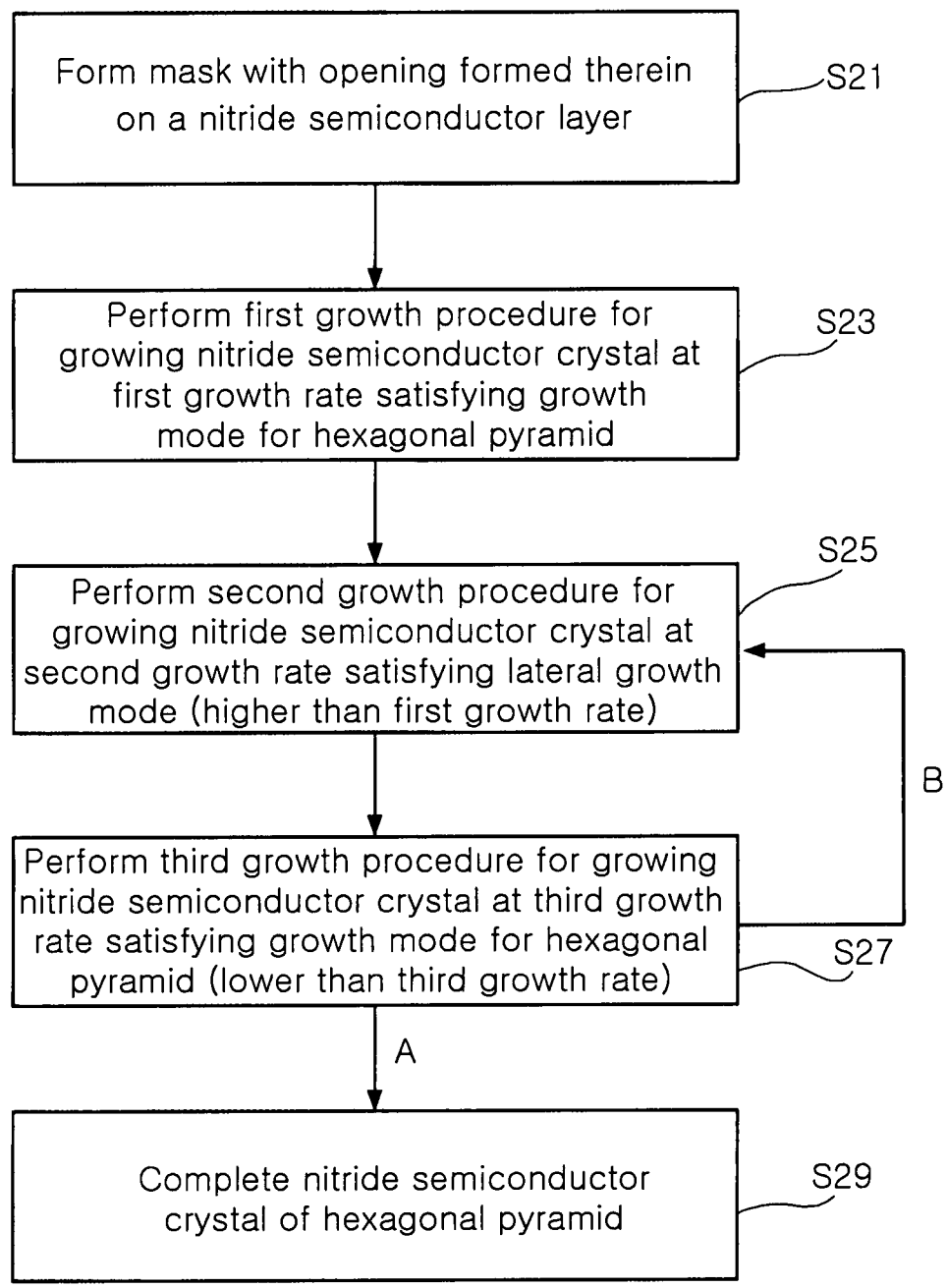
FIG. 2 is a flow chart illustrating an exemplary method for selectively growing a nitride semiconductor according to an aspect of the invention.

FIG. 2 is a flow chart illustrating an exemplary method for selectively growing a nitride semiconductor according to an aspect of the invention.

Referring to FIG. 2, the method for selectively growing a nitride semiconductor according to this embodiment starts with a first step S21, by forming a mask, with an opening perforated therein, on a nitride semiconductor layer.

Typically, the nitride semiconductor layer is formed on a substrate, which is made of one selected from a group consisting of sapphire, SiC, Si, ZnO, $MgAl_2O_4$, MgO, $LiAlO_2$, $Ga_2O_3$ and $LiGaO_2$. The mask can be made of a silicone oxide film or a silicone nitride film. The opening in the mask defines an area where a nitride semiconductor crystal of a hexagonal pyramid starts to grow.

Next, a nitride semiconductor crystal is selectively grown on the area of the nitride semiconductor layer exposed through the opening. The nitride semiconductor layer is selectively grown into a hexagonal pyramid having crystal planes inclined with respect to a top surface of the nitride semiconductor layer. Also, the nitride semiconductor layer includes at least one intermediate stress-relieving area having crystal planes inclined at a greater angle than those of upper and lower areas of the nitride semiconductor layer. Notably, the intermediate stress-relieving area of the invention gives an interruption between the inclined crystal planes, which otherwise may be connected continuously as in the prior art, thereby relieving stress caused by inclined side surfaces.

To selectively grow the nitride semiconductor crystal according to an aspect of the invention, as shown in FIG. 2, a growth rate can be regulated to change a growth mode. The "growth rate" in this specification is construed as a growth rate according to a planar growth reduction, unless explicitly expressed otherwise.

First, in the first growth procedure, the nitride semiconductor crystal is grown at a first growth rate which satisfies a growth mode for a hexagonal pyramid, as in S25. Preferably, the first growth rate ranges from 7 μm/hr to 9 μm/hr. The growth rate can be adequately controlled by growth temperature, pressure and/or a group V/III ratio.

In a specific example, the nitride semiconductor crystal is grown in a larger area than the opening of the mask when it is beyond the thickness of the mask. This reduces dislocation and ensures the nitride semiconductor crystal to be grown under suitable conditions into the pyramid having inclined crystal planes. As described above, in the initial growth step for forming the pyramid, optionally, a growth mode can be changed. Therefore, the first growth rate in the first growth procedure may not be constant necessarily.

Next, a second growth procedure is performed to grow the nitride semiconductor crystal at a second growth rate, which is lower than the first growth rate as in S25. This procedure allows the nitride semiconductor crystal to have inclined crystal planes. In this second growth, the nitride semiconductor crystal is more laterally grown than in the typical growth condition for forming the pyramid. This accordingly results in formation of an intermediate stress-relieving area having crystal planes inclined at a greater angle than those of the nitride semiconductor crystal obtained through the first growth procedure. This intermediate stress-relieving area interrupts continuity of the inclined side surfaces by separating the inclined crystal planes grown in the first growth procedure from the inclined crystal planes to be grown in the following third growth procedure, thereby relaxing stress caused by the inclined side surfaces.

To further enhance effects of interrupting the continuity of the inclined planes, the intermediate stress-relieving area in this procedure is preferably grown at a growth rate at least 20% higher than the first growth rate. This ensures the intermediate stress-relieving area to clearly differ from the inclined crystal planes of the remaining area. For example, in a case where the first growth rate is in the range of 7.5 μm/hr, preferably, the second growth procedure is carried out at a growth rate of at least 9 μm/hr. As described above, the growth rate is controlled by regulating growth temperature, pressure and/or a group V/III ratio. It is preferable to control the growth rate by regulating a flow rate of a group III source gas in order to change the growth mode relatively rapidly.

Afterwards, a third growth procedure is conducted to grow the nitride semiconductor crystal at a third growth rate which satisfies a growth mode for a hexagonal pyramid, as in S27. In this procedure, the third growth rate satisfies growth conditions for the hexagonal pyramid. Thus, the third growth rate is lower than the second growth rate at which the nitride semiconductor crystal is grown more laterally. As described above, the growth rate for changing the growth mode can be controlled by regulating a flow rate of a group III source gas through growth temperature, pressure and/or a group V/III ratio. Here, the growth rate can be preferably controlled by growth temperature. As indicated with an arrow A, the nitride semiconductor crystal of the hexagonal pyramid can be completed by conducting the third growth procedure as in S29. However, as indicated with an arrow B, the second and third growth procedures can be repeated at least once more in order to provide an additional intermediate stress-relieving area and thus further ensure effects of alleviating stress.

FIGS. 3a and 3b are cross-sectional views illustrating an exemplary nitride semiconductor structure of a hexagonal pyramid manufactured by selective growth according to an aspect of the invention.

As shown in FIG. 3a, a nitride semiconductor layer 33 is formed on a substrate 31 where a buffer layer 32 is formed. The nitride semiconductor layer 33 serves as a base layer for growing a nitride semiconductor crystal of the hexagonal pyramid. A mask M, with an opening W formed therein, is formed on the nitride semiconductor layer 33.

As described above with reference to FIG. 2, a nitride semiconductor crystal 34 of the hexagonal pyramid is formed by selective growth using the mask M. The nitride semiconductor crystal 34 has crystal planes inclined with respect to a top surface of the nitride semiconductor layer 33.

An intermediate stress-relieving area 34b has crystal planes inclined at a different angle, and thus interrupts continuity in the inclined side surfaces of the nitride semiconductor crystal 34 of the hexagonal pyramid. That is, the nitride semiconductor crystal 34 has upper and lower areas 34a and 34c separated by the intermediate stress-relieving area 34b. Here, the intermediate stress-relieving area 34b has crystal planes inclined at a greater angle than those θ1 and θ3 of the upper and lower areas 34a and 34c of the nitride semiconductor crystal. A factor for maximizing effects of relaxing stress induced by the inclined side surfaces concerns a range of the inclination angle θ2 of the intermediate stress-relieving area 34b as described in FIG. 2. Another factor can be a thickness t of the intermediate stress-relieving area 34b. Preferably, the intermediate stress-relieving area 34b has a thickness t of at least 0.1 μm. Meanwhile, the intermediate stress-relieving area 34b with too great a thickness t may degrade effects of the hexagonal pyramid and thus preferably, the thickness t thereof does not exceed about 2 μm.

As in this embodiment, the upper and lower areas 34a and 34c whose inclined crystal planes are interrupted by the intermediate stress-relieving area 34b are grown in substantially the same growth mode to have their crystal planes inclined at an identical angle (θ1≈θ3). However, if desired pyramid growth conditions are met, the upper and lower areas 34a and 34c may have their crystal planes inclined at a slightly different angle θ1 and θ3. For example, in the nitride semiconductor crystal of the hexagonal pyramid, the two areas 34a and 34c may have their crystal planes inclined at a moderately different angle within a range from 60° to 65° in view of better piezoelectric properties. Alternatively, the specific area itself, i.e., the upper or lower area 34a or 34c may have its crystal planes inclined at different angles.

Meanwhile, preferably, the intermediate stress-relieving area 34b has crystal planes inclined at an angle of at least 80° to assure sufficient effects of interrupting the inclined side surfaces. However, even though the intermediate stress-relieving area is more laterally grown, in a case where additional crystal growth thereon is required, the intermediate stress-relieving area may have crystal planes inclined preferably at an angle of at least 150° and more preferably at an angle of at least 100°.

The nitride semiconductor crystal 34 of the hexagonal pyramid has inclined crystal planes determined by a crystal plane of a top surface of the substrate or a top surface of the nitride semiconductor layer. In a case where the substrate has a top surface with a C-oriented crystal plane, the nitride semiconductor crystal 34 may have crystal planes selected from a group consisting of an M-oriented plane (1-100), an S-oriented plane (1-101), an A-oriented plane (11-20), an R-oriented plane (1-102), an N-oriented plane (11-23) and an equivalent thereof. But the S-oriented plane is preferable in terms of better piezoelectric properties. Given this, preferably, the nitride semiconductor crystal 34 of the hexagonal pyramid has an S-oriented crystal plane, excluding the intermediate stress-relieving area 34. Since the crystal planes of the intermediate stress-relieving area 34b are determined by a lateral growth mode condition, they are not defined by a specific crystal plane. But the intermediate stress-relieving area 34b has a non-S-plane when the upper and lower areas 34b have S-oriented crystal planes.

In this embodiment, as shown in FIG. 3b, the nitride semiconductor crystal 34 of the hexagonal pyramid features a two-tier structure having one intermediate stress-relieving area 34b. However, the nitride semiconductor crystal 34 may feature three-or-more-tier structure having a plurality of intermediate stress-relieving areas spaced apart from one another.

Figure 4:
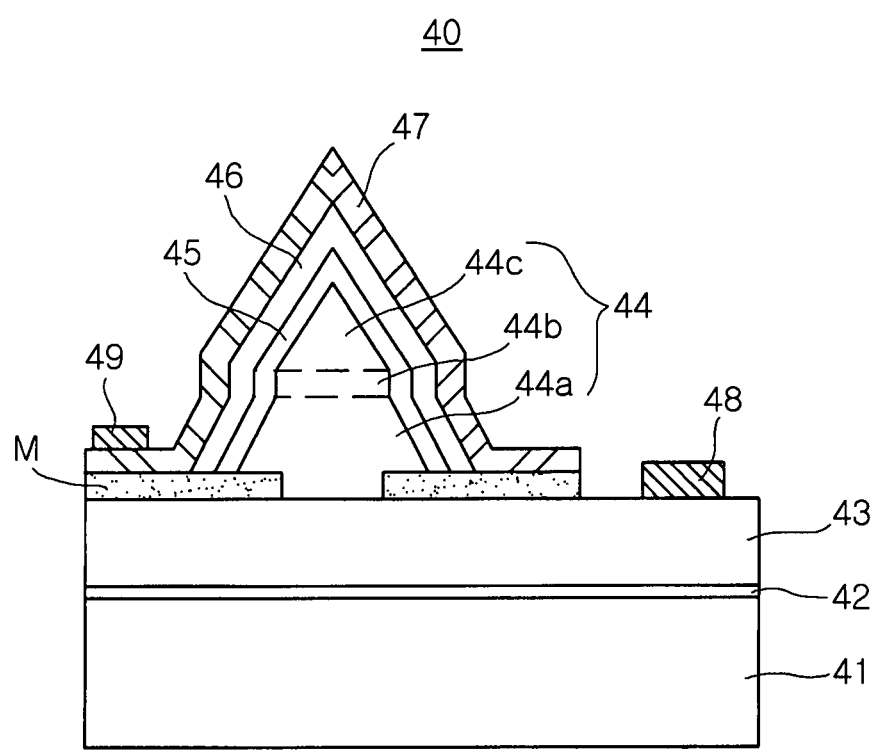
FIG. 4 is a side cross-sectional view illustrating an exemplary nitride semiconductor device of a hexagonal pyramid according to another aspect of the invention.

FIG. 4 is a side cross-sectional view illustrating a nitride semiconductor device of a hexagonal pyramid according to another aspect of the invention.

In the nitride semiconductor device according to this embodiment, a buffer layer 42 is formed on a substrate 41 and a base layer 43 made of a first conductive nitride semiconductor is formed on the buffer layer 42. A mask M with an opening W formed therein is formed on the base layer 43. At least one first conductive nitride semiconductor crystal 44 of the hexagonal pyramid is selectively grown on the base layer 43 to have crystal planes inclined with respect to a top surface of the base layer 43.

As shown in FIG. 4, an intermediate stress-relieving area 44b has crystal planes inclined at a different angle, and thus interrupts continuity in inclined side surfaces of the nitride semiconductor crystal 44 of the hexagonal pyramid. That is, the nitride semiconductor crystal 34 has upper and lower areas 44a and 44c separated by the intermediate stress-relieving area 34b. Here, the intermediate stress-relieving area 44b has crystal planes inclined at a greater angle than those of the upper and lower areas 44a and 44c of the nitride semiconductor crystal.

In the nitride semiconductor light emitting device 40 according to this embodiment, an active layer 45 and a second conductive nitride semiconductor layer 46 are sequentially formed on the first conductive nitride semiconductor crystal 44 of the hexagonal pyramid. A transparent electrode 47 is formed on the second conductive nitride semiconductor layer 46. Also, a first electrode 48 is formed on a portion of the base layer 43 of the first conductive nitride semiconductor and a second electrode 49 is formed on a portion of the transparent electrode 47. These electrodes 48 and 49 can be arranged variously.

In this embodiment, the intermediate stress-relieving area 44b interrupts the continuous inclined side surfaces of the hexagonal pyramid 44 into two areas 44a and 44c in addition thereto. This significantly reduces local stress caused by the increased length of the inclined surfaces. Such less stress allows the active layer 45 to be formed with less difference in thickness on the first conductive nitride semiconductor crystal 44. That is, unlike the prior art structure without the intermediate stress-relieving area 44b, there is a much smaller difference between a thickness of the active layer 45 formed around an apex of the hexagonal pyramid and that of the active layer 45 formed around a base thereof. This ensures a quantum well layer and a quantum barrier layer constituting the active layer 45 to have uniform thickness and In contents. This accordingly overcomes a reliability problem of a light emitting wavelength that may arise from difference in thickness and In content.

Also, as described above, stress from the inclined crystal planes is known to deteriorate p-doping properties of the second conductive nitride semiconductor layer 46. However, in the nitride semiconductor 44 of the hexagonal pyramid, stress can be relatively decreased by the intermediate stress-relieving area 44b, thereby improving p-doping properties.

Various desired conditions of the intermediate stress-relieving area 44b according to this embodiment of the invention can be understood in connection with the conditions described with reference to FIGS. 3a and 3b.

Figure 3:
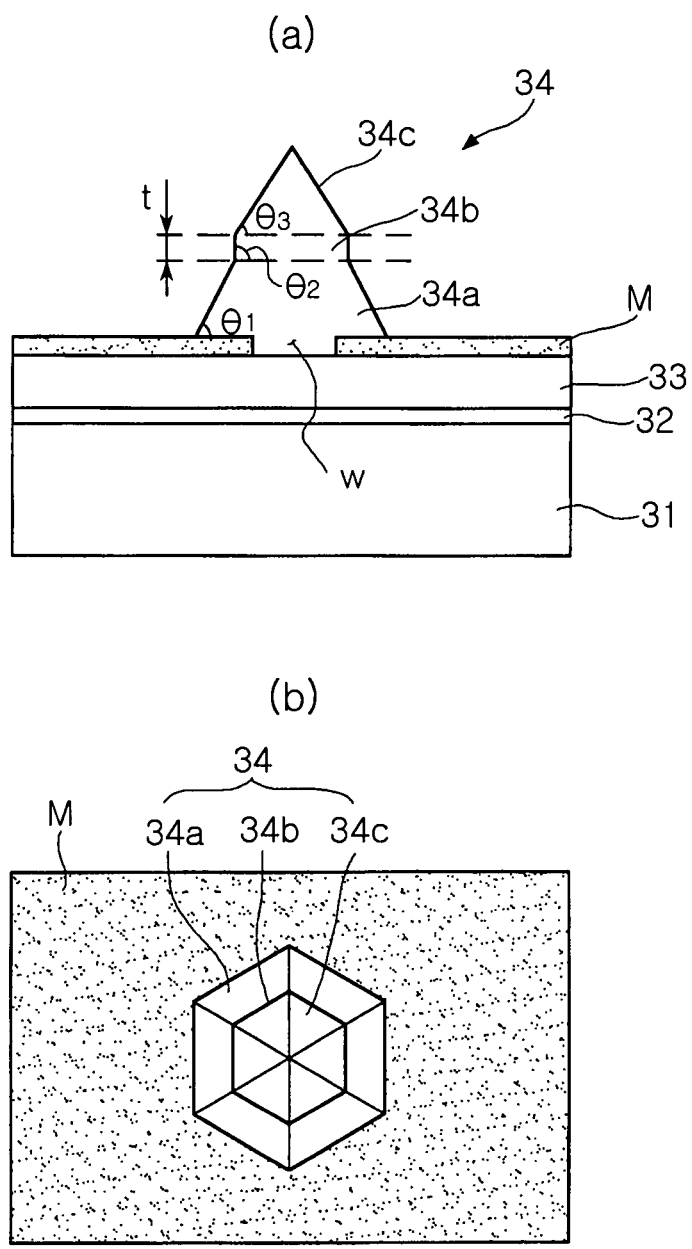
FIGS. 3a and 3b are a side cross-sectional view and a plan view illustrating an exemplary nitride semiconductor of a hexagonal pyramid selectively grown according to another aspect of the invention, respectively.

FIGS. 3 and 4 illustrate only one hexagonal pyramid, but alternatively the number of the openings may be increased to produce an array where a plurality of hexagonal pyramids are arranged.

Now a detailed explanation will be given about a nitride semiconductor crystal of a hexagonal pyramid having an intermediate stress-relieving area therein by way of example.

EXAMPLE

A low-temperature buffer layer was formed on a sapphire substrate and an n-type GaN layer was formed as a base layer via Metal Organic Chemical Vapor Deposition (MOCVD). Then, a SiO$_2$ mask having an opening with a diameter of about 4 μm was formed on the n-type GaN layer.

To grow a hexagonal pyramid, a GaN crystal was grown at a temperature of 950° C. and at a growth rate of about 8 μm/hr for an hour. Here, a growth pressure was 400 torr and a group V/III ratio was about 3,000. Then, to allow the GaN crystal to grow more laterally, a flow rate of trimethyl gallium (TMG) was increased to raise a growth rate to about 10 μm/hr with other conditions maintained constant, repeating a growth process for the intermediate stress-relieving area. The growth process for the intermediate stress-relieving area continued for about five minutes and then the n-type GaN crystal of a hexagonal pyramid was grown under the same condition as previously adopted.

Figure 5:
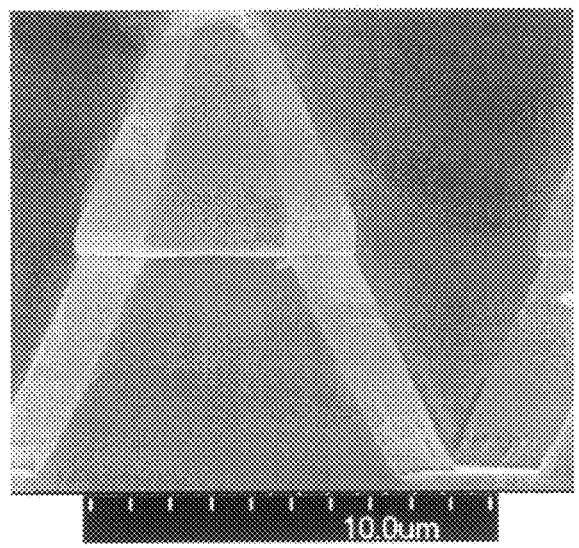
FIGS. 5a and 5b are SEM pictures illustrating an n-type nitride semiconductor manufactured according to an embodiment of the invention, seen from different angles.
Figure 5:
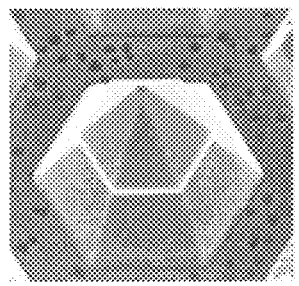

FIGS. 5a and 5b illustrate the n-type nitride semiconductor crystal of a hexagonal pyramid manufactured.

According to this example, an intermediate stress-relieving area was formed in an area of the pyramidal structure, grown more horizontally than under the pyramidal growth conditions. Here, the intermediate stress-relieving area had crystal planes inclined at substantially 90°. Also, inclined side surfaces of an overall pyramidal structure were interrupted by the intermediate stress-relieving area, thereby lowering stress arising from the continuous inclined side surfaces of the hexagonal pyramidal crystal.

As set forth above, according to exemplary embodiments of the invention, a intermediate stress-relieving area having crystal planes inclined at a greater angle than those of other areas of a nitride semiconductor crystal is employed to interrupt continuous inclined side surfaces of a hexagonal pyramid into smaller areas, thereby alleviating stress. A nitride semiconductor light emitting device of the invention accordingly ensures an active layer to be formed with a more uniform thickness, thereby improving p-type doping properties.

While the present invention has been shown and described in connection with the preferred embodiments, it will be apparent to those skilled in the art that modifications and variations can be made without departing from the spirit and scope of the invention as defined by the appended claims.

What is claimed is:

1. A method for selectively growing a nitride semiconductor comprising:

forming a mask, with an opening formed therein, on a nitride semiconductor layer; and selectively growing a nitride semiconductor crystal on a portion of the nitride semiconductor layer exposed through the opening in the mask, the nitride semiconductor crystal shaped as a hexagonal pyramid and having crystal planes inclined with respect to a top surface of the nitride semiconductor, wherein the step of selectively growing the nitride semiconductor crystal comprises:

performing a first growth procedure for growing a lower area of the nitride semiconductor crystal at a first growth rate which satisfies a growth mode for the hexagonal pyramid;

forming an intermediate stress-relieving area by performing a second growth procedure for growing the nitride semiconductor crystal at a second growth rate higher than the first growth rate thereby resulting in the intermediate stress-relieving area having crystal planes inclined at a greater angle relative to the top surface of the nitride semiconductor than those of the lower area and an upper area of the nitride semiconductor crystal, the intermediate stress-relieving area relieving stress which occurs from continuity in the inclined crystal planes; and performing a third growth procedure for growing the upper area of the nitride semiconductor crystal at a third growth rate which satisfies a growth mode for the hexagonal pyramid, the third growth rate being lower than the second growth rate.

2. The method according to claim 1, wherein the step of selectively growing the nitride semiconductor crystal comprises repeating the second and third growth procedures at least once.

3. The method according to claim 1, wherein the first and third growth rates are identical.

4. The method according to claim 1, wherein the second growth rate is at least 20% higher than the first growth rate.

5. The method according to claim 1, wherein the first and third growth rates range from 7 μ/hr to 9 μm/hr and the second growth rate is at least 10 μm/hr.

6. The method according to claim 1, wherein the intermediate stress-relieving area has a thickness ranging from 0.1 μm to 2 μm.

7. The method according to claim 1, wherein the nitride semiconductor crystal of the hexagonal pyramid excluding the intermediate stress-relieving area has S-oriented crystal planes, and the intermediate stress-relieving area has non-S crystal planes.

8. The method according to claim 1, wherein the nitride semiconductor crystal of the hexagonal pyramid excluding the intermediate stress-relieving area has crystal planes inclined at an angle of 60° to 65°, and the intermediate stress-relieving area has crystal planes inclined at 80° to 150°.

9. A method for manufacturing a nitride semiconductor light emitting diode comprising:

forming a mask, with at least one opening formed therein, on a base layer made of a first conductive nitride semiconductor;

selectively growing a first conductive nitride semiconductor crystal on the base layer exposed through the opening in the mask, the first conductive nitride semiconductor crystal shaped as a hexagonal pyramid and having crystal planes inclined with respect to a top surface of the base layer; and sequentially growing an active layer and a second conductive nitride semiconductor layer on the first conductive nitride semiconductor crystal, wherein the step of selectively growing the first conductive nitride semiconductor crystal comprises:

performing a first growth procedure for growing a lower area of the nitride semiconductor crystal at a first growth rate which satisfies a growth mode for the hexagonal pyramidal structure;

forming an intermediate stress-relieving area by performing a second growth procedure for growing the nitride semiconductor crystal at a second growth rate higher than the first growth rate thereby resulting in the intermediate stress-relieving area having crystal planes inclined at a greater angle relative to the top surface of the base layer than those of the lower area and an upper area of the nitride semiconductor crystal, the intermediate stress-relieving area relieving stress which occurs from continuity in the inclined crystal planes;

performing a third growth procedure for growing the upper area of the nitride semiconductor crystal at a third growth rate which satisfies a growth mode for the hexagonal pyramidal structure, the third growth rate being lower than the second growth rate.

10. The method according to claim 9, wherein the step of selectively growing the first conductive nitride semiconductor crystal comprises repeating the second and third growth procedures at least once.

11. The method according to claim 9, wherein the first and third growth rates are identical.

12. The method according to claim 9, wherein the second growth rate is at least 20% higher than the first growth rate.

13. The method according to claim 9, wherein the first and third growth rates range from 7 μm/hr to 9 μm/hr and the second growth rate is at least 10 μm/hr.

14. The method according to claim 9, wherein the intermediate stress-relieving area has a thickness from 0.1 μm to 2 μm.

15. The method according to claim 9, wherein the first conductive nitride semiconductor crystal of the hexagonal pyramid excluding the intermediate stress-relieving area has S-oriented crystal planes, and the intermediate stress-relieving area has non-S crystal planes.

16. The method according to claim 9, wherein the first conductive nitride semiconductor crystal of the hexagonal pyramid excluding the intermediate stress-relieving area has crystal planes inclined at an angle of 60° to 65°, and the intermediate stress-relieving area has crystal planes inclined at 80° to 150°.

17. The method according to claim 9, wherein the active layer and the second conductive nitride semiconductor layer are sequentially formed on the crystal surface of the intermediate stress-relieving area and the crystal surfaces of the upper and lower areas.

* * * * *